(12) United States Patent  
Greidanus et al.

(10) Patent No.: US 7,578,163 B2
(45) Date of Patent: Aug. 25, 2009

(54) SYSTEM AND METHOD FOR CALIBRATING AN ADJUSTABLE DELAY TIME FOR A DELAY MODULE

(75) Inventors: Henry Steven Greidanus, Kanata (CA); Rami Emad Labib, Ottawa (CA)

(73) Assignee: Alcatel-Lucent Canada Inc, Kanata, ON (CA)

( * ) Notice: Subject to any disclaimer, the term of this patent is extended or adjusted under 35 U.S.C. 154(b) by 212 days.

(21) Appl. No.: 11/702,656

(22) Filed: Feb. 6, 2007

(65) Prior Publication Data

US 2007/0131019 A1     Jun. 14, 2007

Related U.S. Application Data

(62) Division of application No. 10/012,427, filed on Dec. 12, 2001, now Pat. No. 7,283,917.

(51) Int. Cl.
   *G01R 13/30*     (2006.01)
(52) U.S. Cl. ....................................... 73/1.42
(58) Field of Classification Search ........................ None
   See application file for complete search history.

(56) References Cited

U.S. PATENT DOCUMENTS 4,658,225 A * 4/1987 Dukes et al. ................. 333/166
4,703,251 A   10/1987 Baumgartner et al.
4,868,430 A *  9/1989 Stewart ....................... 327/279
5,231,319 A    7/1993 Crafts et al.
5,764,598 A *  6/1998 Okayasu ..................... 368/120
6,316,980 B1  11/2001 Vogt et al.
2002/0060328 A1* 5/2002 Sakurai et al. .............. 257/200

FOREIGN PATENT DOCUMENTS

EP      0 480 860      4/1992

OTHER PUBLICATIONS

"DDR SDRAM Functionality and Controller Read Data Capture", Design Line, pp. 1-24, vol. 8, Issue 3, 3Q99, Micron Technology, Inc., Boise, Idaho, U.S.A.
"DDR SDRAM Functionality and Controller Read Data Capture", Design Line, pp. 1-24, vol. 8, Issue 3, 3Q99, Micron Technology, Inc., Boise, Idaho, U.S.A. 1999.

* cited by examiner

*Primary Examiner*—Robert R Raevis

(57) ABSTRACT

A timing calibration system for an adjustable delay time of a delay module for an electronic circuit is provided. The system includes a control delay module including at least one calibration delay module, the control delay module having a second delay time. The system also includes a timing module associated with the control delay module, a comparison module associated with the timing module and an adjustment module for the delay module. The timing module measures the second delay time, the comparison module compares the second delay time with a desired delay time and produces a comparison result and the adjustment module calibrates the adjustable delay time utilizing the comparison result.

16 Claims, 8 Drawing Sheets

SYSTEM AND METHOD FOR CALIBRATING AN ADJUSTABLE DELAY TIME FOR A DELAY MODULE

This application is a divisional of U.S. patent application Ser. No. 10/012,427, filed Dec. 12, 2001, now U.S. Pat. No. 7,283,917, and incorporated herein by reference.

FIELD OF THE INVENTION

The invention relates generally to a system and method for calibrating an adjustable delay time for a delay module.

BACKGROUND OF THE INVENTION

An application specific integrated circuit (ASIC) is a custom electronic circuit implemented using VLSI technologies that is designed for a specific application. The circuit of the ASIC is made after designing a hardware circuit in software by inserting and connecting various standardized devices together. The devices include latches, multiplexers, counters and logic gates. The software converts the logical connections to a circuit pattern which can be implemented with the ASIC.

A delay module is available for use in the ASIC circuit to provide a delay of a predetermined amount of time. Methods typically used to make this adjustment to a signal utilize a delay-locked loop (DLL) or a phase-locked loop (PLL).

A DLL consists of a delay module with an adjustable delay time and control logic. The DLL samples an input clock and a feedback clock and determines the appropriate delay time to ensure the input clock and the feedback clock are in phase. It calibrates the adjustable delay time of the delay module accordingly. Once the input clock and the feedback clock are in phase, the DLL locks this delay time into the delay module.

A PLL uses a voltage controlled oscillator whose output phase or frequency locks onto and tracks the phase of the feedback signal. The PLL detects any phase difference between the two signals and generates a correction voltage that is applied to the oscillator to adjust its phase. Some PLLs also allow the output clock to have a 1/N clock period phase shift which provides the fixed time delay.

Use of either of these techniques has disadvantages. The delay time of the DLL varies on the characteristics of the phase comparator. The phase comparator of a DLL would have a limited granularity and its delay time would vary according to variations between circuits on the wafer introduced during the manufacturing process of the wafer, operating voltage and operating temperature for the circuit. A PLL is sensitive to signal variations which requires meticulous layout of its control signals. This sensitivity usually imparts restrictions on the placement of the PLL on the die. This may also limit the number of PLLs that can be placed on the die.

Additionally, both a PLL and a DLL require a continuous clock to operate effectively. Gaps or variations in the frequency in the clock signal will cause a PLL or DLL to lose lock.

Many ASIC manufacturers provide in their component library a programmable delay module having an adjustable delay time as an element for an ASIC. Typically, the delay module has an input signal, an output signal and a means for configuring the length of the delay time for the input signal to propagate to the output signal.

A number of factors will cause the delay module in the ASIC to have a delay time in a certain range rather than the desired delay time. This range can be as much as +/−40% from the delay time desired of the delay module. Factors that affect the delay time are variations between circuits on the wafer introduced during the manufacturing process of the wafer (process factors), operating voltage and operating temperature for the ASIC circuit.

Generally, process factors cause the largest variation in delay times. This occurs because each delay module may have variations in deposition sizes for the transistors and interconnections that are used to create the delay module. Increases in voltage and temperature during operation of the ASIC may also lengthen the delay time of the delay module.

There exists a need for a system which addresses the deficiencies of providing accurate times for a delay module for an ASIC.

SUMMARY OF THE INVENTION

In a first aspect of the invention, a timing calibration system for an adjustable delay time of a delay module for an electronic circuit is provided. The system includes a control delay module including at least one calibration delay module, the control delay module having a second delay time. The system also includes a timing module associated with the control delay module, a comparison module associated with the timing module and an adjustment module for the delay module. The timing module measures the second delay time, the comparison module compares the second delay time with a desired delay time and produces a comparison result and the adjustment module calibrates the adjustable delay time utilizing the comparison result.

The desired delay time may include a desired delay time range and if the comparison module determines that the second delay time is less than a lower bound of the desired delay time range, the adjustment module increases the adjustable delay time of the delay module. Also, if the comparison module determines that the second delay time is more than an upper bound of the desired delay time range, the adjustment module decreases the adjustable delay time of the delay module.

The comparison module may include a first comparison sub-module, the first comparison sub-module comparing the second delay time to a lower bound of the desired delay time range to produce a first comparison result and a second comparison sub-module, the second comparison sub-module comparing the second delay time to an upper bound of the desired delay time range to produce a second comparison result, and the adjustment module includes a counter controlled by an enablement pulse, the counter reacting to the first and the second comparison result and the adjustment module calibrates the adjustable delay time based on the counter.

The system may include a signal generator, the signal generator generating a pulse signal provided as a first input signal to the timing module and a second input signal to the control delay module, the control delay module producing an output signal provided as a third input signal to the timing module.

The system may provide for an edge of the first input signal initiating the timing module to start a timer and an edge of the third input signal stoping the timer, the second delay time being an amount of time measured by the timer.

The delay module may include at least one delay sub-module and the calibration delay modules may include a number of calibration delay modules.

The calibration delay modules may include a facsimile of the delay module.

The adjustment module may calibrate the second delay time of the control delay module.

The timing module may be a counter.

The comparison module may be a comparator.

The system may also include a desired delay time register associated with the comparison module, the desired delay time register storing the desired delay time and providing the desired delay time to the comparison module. The system may also include an adjustment register associated with the adjustment module, the adjustment register storing an adjustment value generated by the adjustment module, the adjustment module adjusting the adjustable delay time of the delay module utilizing the adjustment value.

The system may also include a range lock for the desired delay time register, the range lock selectively preventing alteration of the desired delay time stored in the desired delay time register.

The system may also include an adjustment lock for the adjustment register, the adjustment lock selectively preventing alteration of the adjustment value stored in the adjustment register.

The system may also include a processor associated with the adjustment module, the processor operating a program which provides the desired delay time to the desired delay time register, accesses an output from the adjustment module, generates the adjustment value from the output and provides the adjustment value to the adjustment register.

The system may be embodied in an ASIC.

In a second aspect of the invention, a calibrated delay module for an electronic circuit is provided. The module includes a delay module having an adjustable delay time, a control delay module comprising at least one calibration delay module, the control delay module having a second delay time, a timing module associated with the control delay module, a comparison module associated with the timing module and an adjustment module for the delay module. The timing module measures the second delay time, the comparison module compares the second delay time with a desired delay time and produces a comparison result and the adjustment module calibrates the adjustable delay time utilizing the comparison result.

In a third aspect of the invention, a method of calibrating an adjustable delay time associated with a delay module for an electronic circuit is provided. The method includes the steps of measuring a cumulative delay time in a control delay module of the electronic circuit, the cumulative delay time being a function of the adjustable delay time, comparing the cumulative delay time with a desired delay time to produce a comparison result and calibrating the adjustable delay time of the delay module based on the comparison result.

In a fourth aspect of the invention, a calibration system for an adjustable unit value of a unit module for an electronic circuit is provided. The system includes a control module comprising at least one scaled unit module, the control module having a scaled unit value, a measurement module associated with the control module, a comparison module associated with the measurement module and an adjustment module for the unit module. The measurement module measures the scaled unit value, the comparison module compares the scaled unit value with a desired unit value and produces a comparison result and the adjustment module calibrates the adjustable unit value based on the comparison result.

In other aspects, the invention provides various combinations and subsets of the aspects described above.

BRIEF DESCRIPTION OF THE DRAWINGS

The foregoing and other aspects of the invention will become more apparent from the following description of specific embodiments thereof and the accompanying drawings which illustrate, by way of example only, the principles of the invention. In the drawings, where like elements feature like reference numerals (and wherein individual elements bear unique alphabetical suffixes).

DETAILED DESCRIPTION OF AN EMBODIMENT

Figure 1:
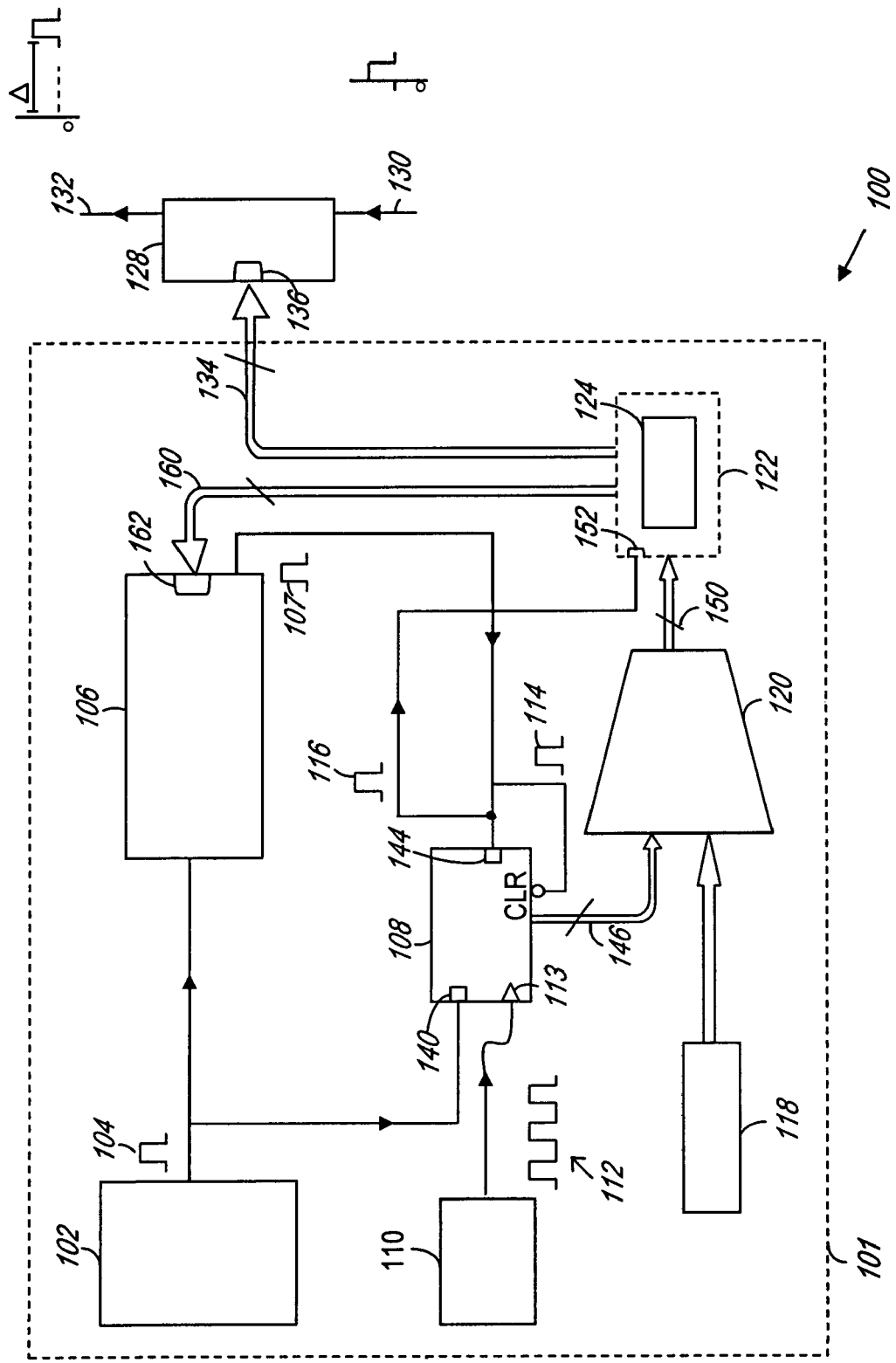
FIG. 1 is a block diagram showing a calibration module for an electronic circuit in accordance with an embodiment of the invention.

The description which follows, and the embodiments described therein, are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

The embodiment relates to a system and method for calibrating an adjustable delay time of a delay module. The embodiment is suited for use in an ASIC. However, it will be appreciated that the system may be used in other circuits, including discrete circuits.

Briefly, the system of the embodiment calibrates an adjustable delay time for a delay module in the following manner. The system has a control delay module having a number of delay sub-elements. Each sub-element is a facsimile if not a copy of the delay element. The control delay module generates a calibrated timing signal related to the desired delay time for the delay module. In the embodiment, the calibrated timing signal represents a cumulative delay time for the sub-elements which is related to the adjustable delay time of the delay module. The cumulative delay time can then be compared against a scaled value of the desired delay time for the delay module. From the comparison, the delay module can be adjusted to produce a delay time calibrated towards the desired delay time. This system and method provides a mechanism for providing a calibrated delay time for a delay module without using a PLL or a DLL. The system and method also do not require a signal to propagate through the delay module in order to calibrate its adjustable delay time. Accordingly, the system and method can operate independently of the delay module. Additionally, unlike a PLL or DLL system having a localized calibration system, one system may calibrate multiple delay modules.

First, referring to FIG. 1, a description of an electronic circuit containing an embodiment of the system and method is provided. In a broad aspect, electronic circuit 100 has calibration module 101 and delay module 128.

Delay module 128 provides a programmable delay time for an ASIC by providing a stepped range of possible delay times for delay module 128. The input signal 130 is provided to delay module 128 and is delayed by a programmable amount of time, Δ. Output signal 132 is produced by delay module 128 and is a Δ-delayed version of signal 130. Δ is set by providing suitable control signals 134 to control input 136 of delay module 128.

Calibration module 101 generates control signals 134. Calibration module 101 comprises signal generator 102, control delay module 106, timing module 108, clock 110, comparison module 120, adjustment module 122 and register 118. As is discussed below, various modules in calibration module 101 generate input and output signals which are manipulated by other modules in calibration module 101 to ultimately generate control signal 134.

To begin a calibration cycle, signal generator 102 generates pulse signal 104. Control delay module 106 receives pulse signal 104 and propagates it through its internal delay elements. The pulse is ultimately delayed by module 106 by a measurable amount of time. It is the amount of time that pulse signal 104 is delayed by control delay module 106 which provides basic data on how to calibrate delay module 128. Output signal 107 is a delayed version of pulse signal 104. Control delay module 106 provides a stepped range of possible delay times. It will be appreciated that pulse signal 104 and clock signal 112 may be derived from the same signal generator.

Timing module 108 measures the delay time between pulse signal 104 and output signal 107. Time measurement by timing module 108 is activated by the leading edge of pulse signal 104 which is provided to start terminal 140. Time measurement by timing module 108 is deactivated by the leading edge of output signal 107 which is provided to stop terminal 144. A count value for the measured time is encoded in n-bit in timing module 108 on output lines 146. Clock 110 produces clock signal 112 which is provided to the clock input 113 of timing module 108. Accordingly timing module 108 counts the number of pulses in clock signal 112 from when the module is activated to when it is deactivated.

The count value is dependent on the difference in time between the arrival of the leading edges of pulse signal 104 and output signal 107 at timing module 108 and the frequency of clock signal 112. The propagation time of pulse signal 104 through control delay module 106 is the value of the count value in timing module 108 multiplied by the clock period of clock signal 112.

Once the count value of the delay time for control module 106 is measured, the count value must be compared against a calibration value related to a desired count value for the delay module 128. The desired count value is calculated from the desired delay time for control delay module 106 given the delay time required for electronic circuit 100. Comparison module 120 performs the comparison function. The count value measured from control delay module 106 is provided to comparison module 120 via output signals 146 to compare the count value against this calibration value. In the embodiment, this calibration value is a binary value of a desired delay time of control delay module 106 divided by the clock period of clock signal 112. Comparison module 120 produces a comparison result which is sent to adjustment module 122 in control signal 150. Further detail on the operation of comparison module 120 is provided later.

Adjustment module 122 adjusts the programmable delay time of delay module 128 based on the result provided by comparison module 120. Control delay module 106 is also re-calibrated. This is done through control signal 160 provided to control terminal 162 of control delay module 106. Afterwards, a new pulse signal 104 may be sent to by control delay module 106 and delay module 128 may be calibrated again.

In the embodiment, timing module 108 is a timer, clock signal 112 is a 334 MHz clock signal and comparison module 120 is a comparator.

Figure 2:
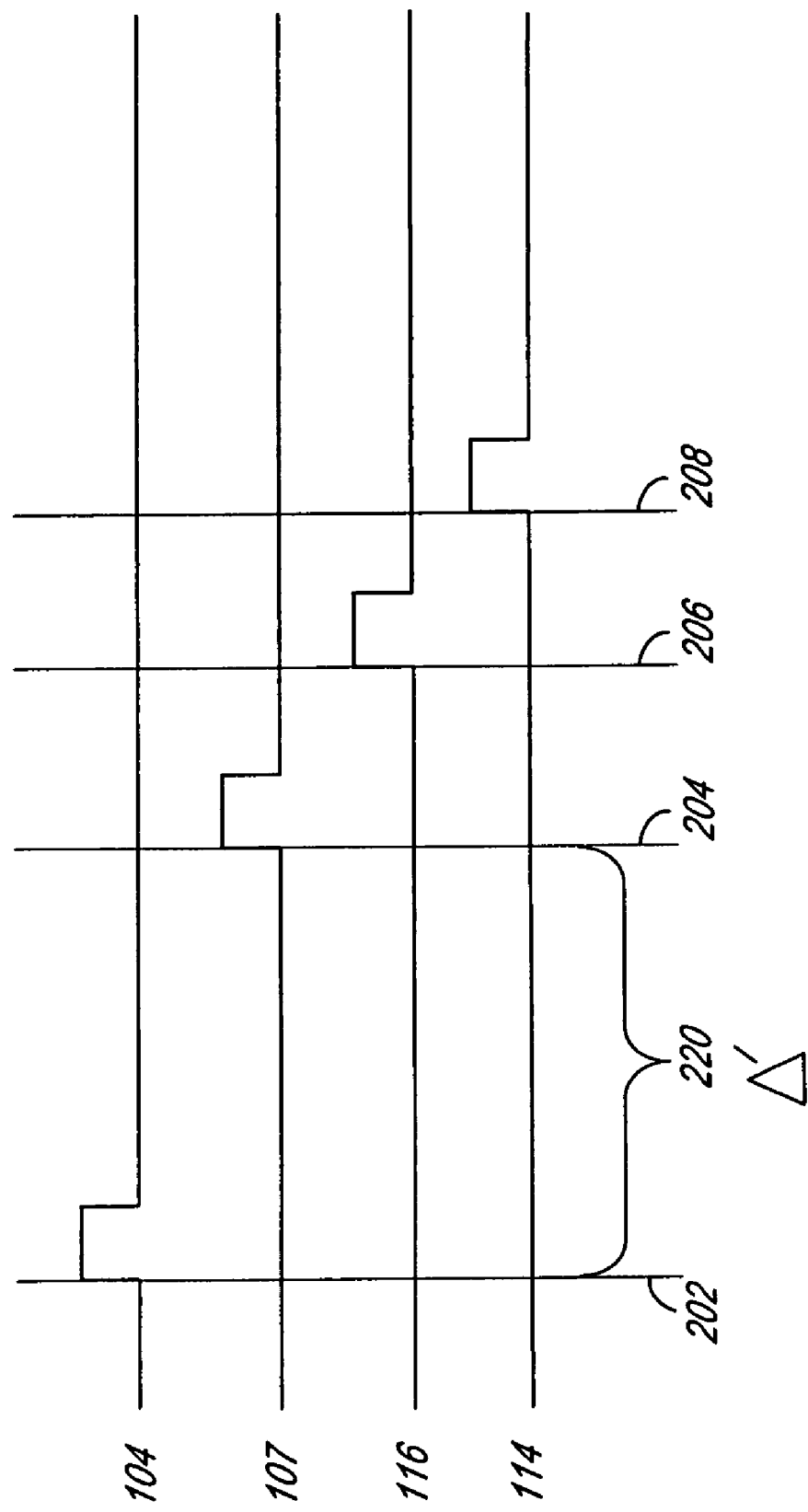
FIG. 2 is a timing diagram of the timing signals of the calibration module of the electronic circuit of FIG. 1.

Referring to FIG. 2, timing diagram 200 illustrates pulse signal 104 provided to start terminal 140 at time 202 wherein, at that time, the counting is initiated. Output signal 107 generated from control module 106 is delayed by delay 220 of Δ' from the initiation of input pulse. 104. The rising edge of output signal 107 stops timing module 108 at time 204.

Output signal 107 is also used to generate enablement pulse signal 116 which is provided to enablement input 152 of adjustment module 122 at time 206. Upon being activated by enablement pulse signal 116, adjustment module 122 determines an adjustment value for delay module 128 based on the produced comparison result. The adjustment value is stored in register 124 and provided as a binary signal 134 to control input 136 of delay module 128.

In the embodiment, adjustment module 122 determines whether the delay should be increased, decreased or not adjusted. If adjustment module 122 determines that the delay for delay module 128 should be adjusted, it sends control signal 134 which causes delay module 128 to increase or decrease its adjustable delay time by one step. Control delay module 106 is similarly adjusted by sending control signal 160. If the delay for delay module 128 requires further adjustment, calibration module 101 adjusts delay module 128 upon calibration module 101 performing another calibration cycle beginning with another pulse signal 104. It will be appreciated that calibration module 101 may be programmed to adjust the adjustable delay time of delay module 128 by more than one step in a calibration cycle. This adjustment may initially over-compensate for the variation in the delay time of delay module 128 from its desired delay time. Calibration module 101 then re-adjusts delay module 128. Programming calibration module 101 with an adjustment algorithm which results in a series of over-compensating adjustments provides an under-damped adjustment scheme for calibration module 101. Similarly, calibration module 101 may be programmed to calculate the number of steps to adjust the adjustable delay time of delay module 128 providing a critically-damped adjustment scheme. The embodiment provides an overdamped adjustment scheme which does not over-compensate for the variation in the delay time of delay module 128 but approaches its desired delay time in one step increments.

It will be appreciated that calibration of delay module 128 may only be accomplished in a window of time between time 204 and time 208. Calibration may not be accomplished prior to time 204 since the delay time propagated to output signal 107 is not known before this time. Output signal 107 also generates clear pulse signal 114 which clears timing module 108 at time 208 (FIG. 2). Calibration may not be accomplished after time 208 since timing module 108 has been reset after this point. The relative timing of the transitions of the signals produces these boundaries. Calibration module 101 is implemented using a state machine to control the timing of signals.

Figure 7:
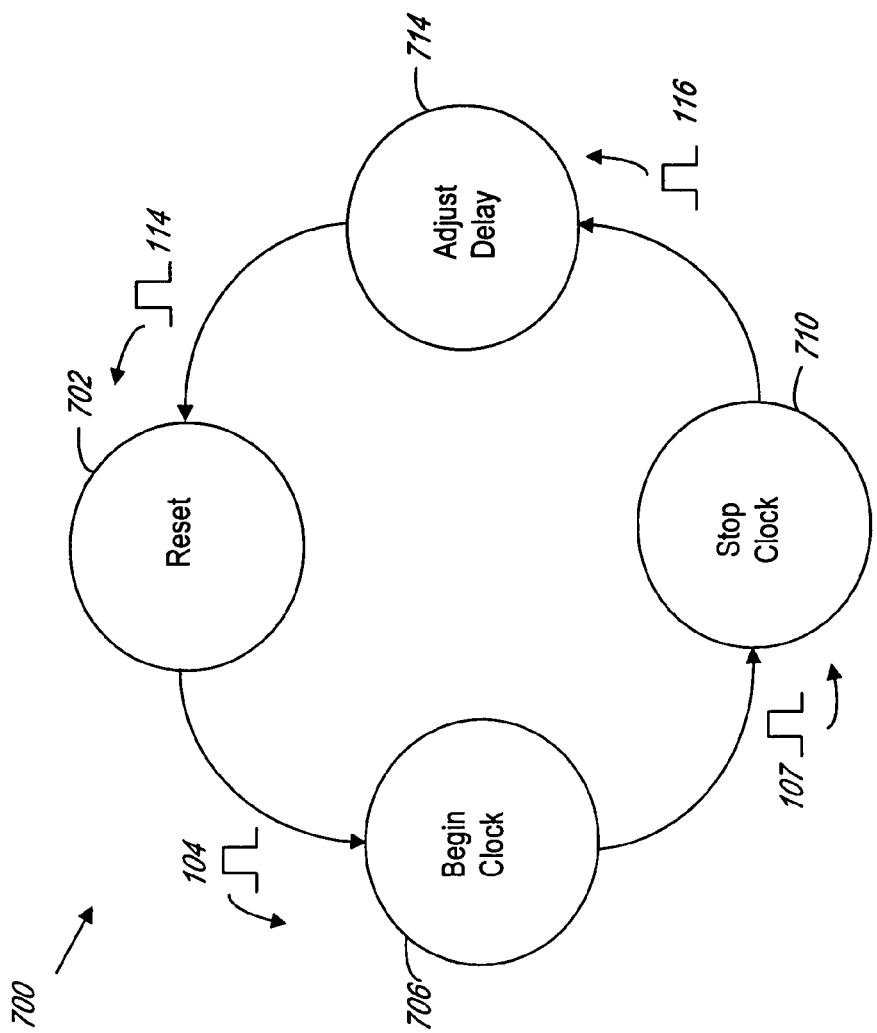
FIG. 7 is a state diagram of state transitions of the electronic circuit of FIG. 1; and, FIG. 8 is a table of an example of delay times and count values calculated by the calibration module of FIG. 1.

Referring to FIG. 7, state diagram 700 illustrating the states and transitions for the algorithm of calibration module 101 is shown. Calibration module 101 is at Reset state 702 on start up of the system employing delay module 128. Calibration module 101 moves to Begin Clock state 704 upon receipt of pulse signal 104 by timing module 108 to begin to measure the count value of control delay module 106. When output signal 107 reaches timing module 108 to complete the measurement of the count value, calibration module 101 progresses to Stop Clock state 710. In this state, comparison module 120 produces a meaningful comparison of the count value associated with the delay time of control delay module 106 and the count value associated with the desired delay time contained in register 118. Enablement pulse signal 116 moves calibration module 101 into Adjust Delay state 714. The arrival of enablement pulse signal 116 at adjustment module 122 enables calibration module 101 to make adjustments after comparator 120 compares the count value measured from control delay module 106 with the count value in register 118. Accordingly, adjustment module 122 is prevented from modifying delay module 128 prior to receiving a meaningful comparison result from comparison module 120. Clear pulse signal 114 clears timing module 108 which moves calibration module 101 back into Reset state 702.

It will be appreciated that, since control delay module 106 has finite granularity for the steps of its possible delay times, the scaled desired delay time of control delay module 106 may not be equal to one of the possible values for its delay time. As such, adjusting the delay time of control delay module 106 will overshoot its scaled desired delay time. For example, the delay time of control delay module 106 may be too long resulting in a decrease in its delay time and the delay time of delay module 128. This one step decrease results in the delay time being too short. The next calibration cycle will then increase the delay time of control delay module 106 and the delay time of delay module 128 by one step resulting in a delay time which is again too long. A calibration module employing this scheme may result in oscillating delay times for control delay module 106 and delay module 128. In another embodiment, this oscillation is avoided by using a scaled desired delay time range for the scaled desired delay time. Accordingly, the delay time generated by control delay module 106 does not require adjustment of delay module 128 if the delay time is within the scaled desired delay time range.

Figure 3:
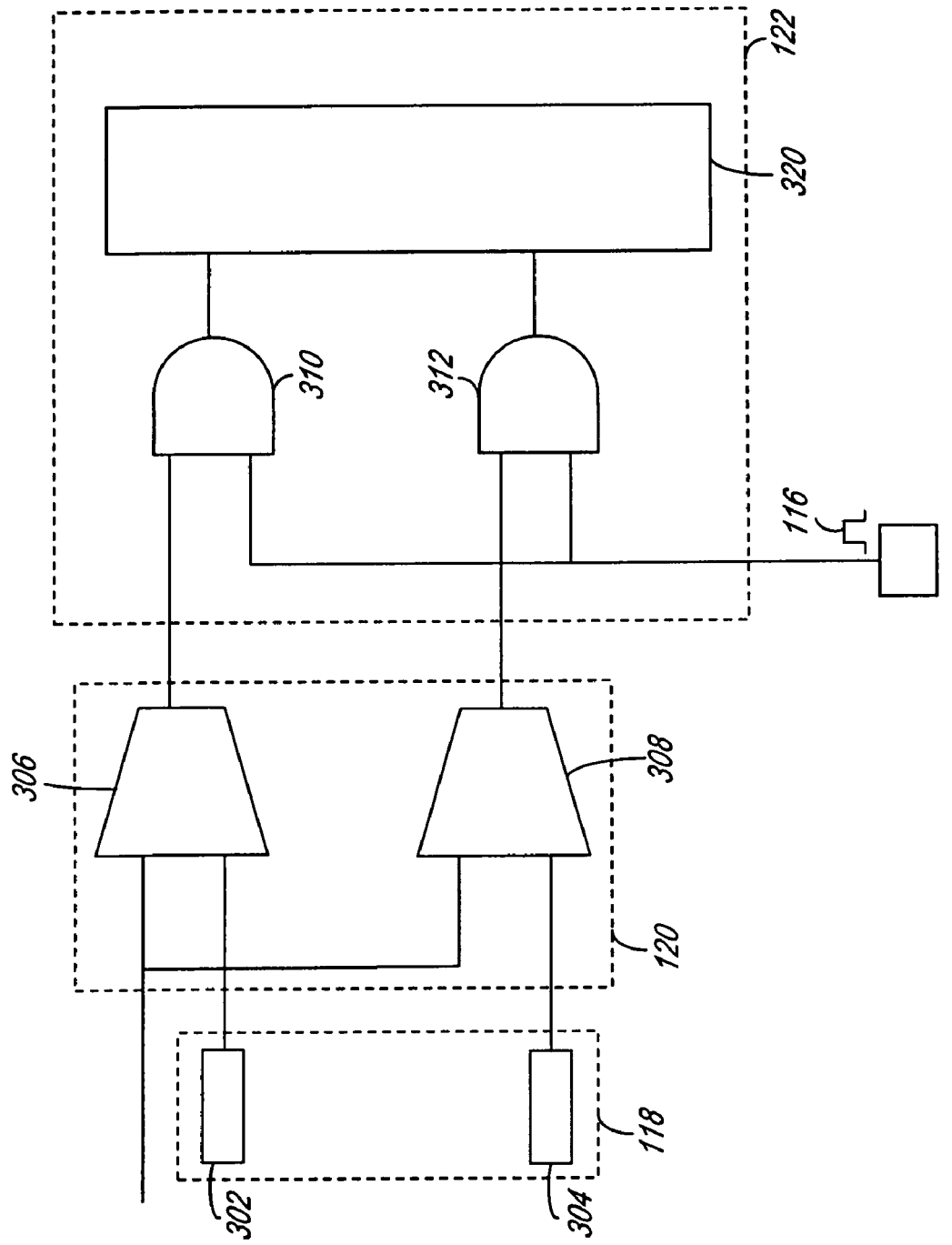
FIG. 3 is a block diagram of a register, comparison module and adjustment module of another embodiment of the calibration module.

Referring to FIG. 3, another adjustment mechanism is shown where register 118 comprises maximum delay time register 302 for storing a count value associated with an upper bound of the desired delay time range and minimum delay time register 304 for storing a count value associated with a lower bound of the desired delay time range. The count values associated with the upper and lower bounds are simultaneously compared with the count value associated with the delay time produced by control delay module 106 in comparison module 120, the upper bound count value being compared with the delay time count value by comparison sub-module 306 and the lower bound count value being compared with the delay time count value by comparison sub-module 308. The results of these comparisons are sent to adjustment module 122. Two AND gates 310 and 312 in adjustment module 122 separately receive each result from comparison sub-modules 306 and 308. Upon receiving enablement pulse signal 116 at time 206, if the comparison indicates that the delay time is below the desired delay time range, AND gate 312 will produce an output signal indicating that the delay time should be increased. If the comparison indicates that the delay time is above the desired delay time range, AND gate 310 will produce an output signal indicating that the delay time should be decreased. It will be appreciated that at most one of the comparisons will generate an adjustment condition. The increase or decrease signal is provided to counter 320 at its respective count increase and count decrease inputs to produce a control signal which causes adjustment module 122 to either increase or decrease the delay time in delay element 128 by one step. It will also be appreciated that neither AND gate 310 or AND gate 312 may produce signals indicating that the delay time should be increased. In this case, no signal is provided to counter 320 and delay elements 128 and 106 are not adjusted. As noted earlier, it will be appreciated that adjustment module 122 may be provided with sufficient logic to produce an under-damped or a critically-damped delay module 128.

Figure 4:
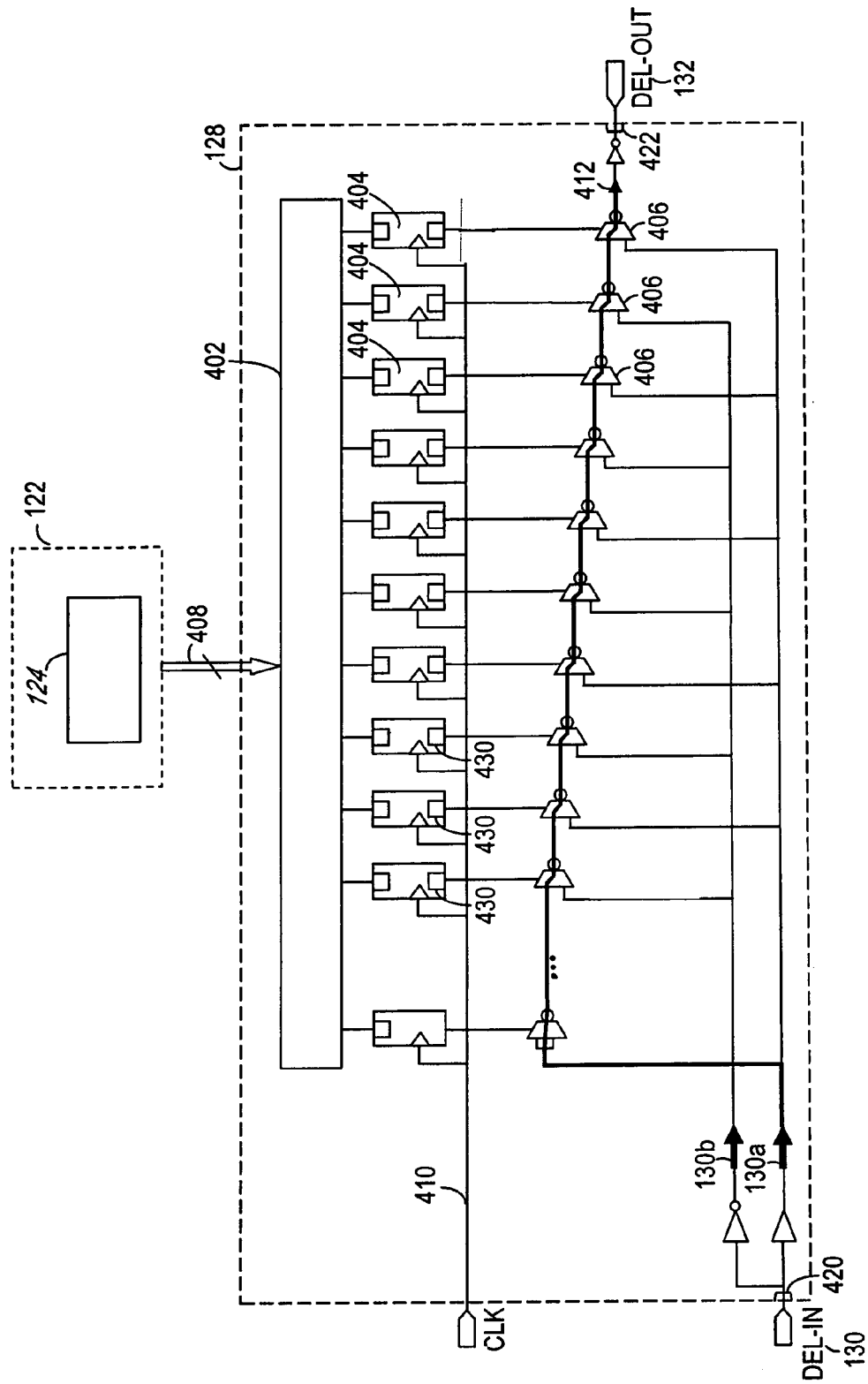
FIG. 4 is a block diagram of a delay module of the electronic circuit of FIG. 1.

Referring to FIG. 4, delay module 128 comprises a plurality of delay sub-modules 406 connected in series from input terminal 420 to output terminal 422. Accordingly, a signal entering delay module 128 will propagate through each element 406 as per arrow 412. In the embodiment, each delay sub-module 406 is an inverting multiplexer which has a nominal propagation delay of 80 ps and delay module 128 consists of thirty-two (32) of such delay sub-modules 406(1), 406(2) . . . 406(32). Delay module 128 also utilizes an alternating inverted and non-inverted input signal 130$a$ and 130$b$ between successive delay sub-modules 406 thereby minimizing the duty-cycle distortion of the delayed signal. This alternating pattern "averages out" propagation discrepancies between propagation delays related to low-to-high signal transitions and high-to-low signal transitions in sub-modules 406. It will be appreciated that there may be any number of delay sub-modules 406 in delay module 128 and delay sub-module 406 may be any component that can be configured to produce a defined delay time including AND gates, OR gates, enabled latches, buffers and resistor-capacitor delays.

As described above, the embodiment allows for the adjustment of the delay time of delay module 128. This is accomplished by activating a selected number of sequential sub-modules 406 and propagating the signal through that block. Sub-modules 406 are individually activated by their enable pins 430. As shown in FIG. 4, as there are 32 delay sub-modules 406 in delay module 128, five binary control lines 408 ($2^5$=32) are required to access each of enable pins 430 of the 32 delay sub-modules 406. Accordingly, in the embodiment, adjustment module 122 issues a five-bit binary signal to decoder 402 through control lines 408 to activate a selected block of delay sub-modules 406. Decoder 402 activates the selected number of delay sub-modules 406 by sending an input signal to enable pins 430 of selection devices 404 controlling their delay sub-modules 406. In the embodiment, selection devices 404 are flip-flops controlled by external clock signal 410.

In the embodiment, adjustment module 122 responsively increases or decreases the adjustable delay time of delay module 128 by activating or deactivating an additional delay sub-module 406 from the number of activated sub-modules per calibration cycle, i.e. one iteration of calibration module 101 beginning with pulse signal 104. It will be appreciated that the increase or decrease in the adjustable delay time of delay module 128 may be accomplished by activating or deactivating more than one delay sub-module 406 per calibration cycle. It will also be appreciated that adjustment module 122 need not gradually increase nor gradually decrease the adjustable delay time of delay module 128 but may activate or deactivate the appropriate number of delay sub-modules 406 in one calibration cycle.

Figure 5:
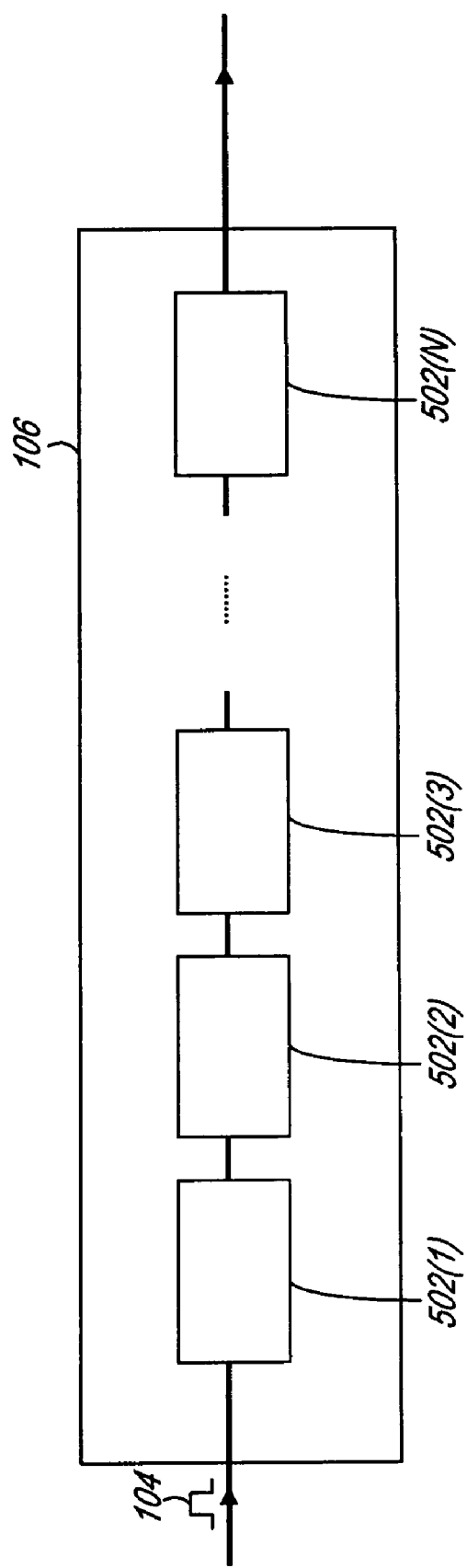
FIG. 5 is a block diagram of a control delay module of the electronic circuit of FIG. 1.

Referring to FIG. 5, as described earlier, control delay module 106 is adjusted to mimic adjustments made to delay module 128. In the embodiment, control delay module 106 contains N calibration delay modules 502(1) to 502(N), each contributing to the delay time of control delay module 106. In the embodiment, each calibration delay module 502 is a facsimile of delay module 128 with a similar logical layout and the same number of delay sub-modules 406. As such, by activating the same number of delay sub-modules 406 in delay module 128 as in each of calibration delay modules 502, a linear relationship between the delay introduced by control delay module 106 and delay module 128 is produced. This one-to-one relationship provides a straightforward delay calculation scheme for calibrating delay cell 128. To maintain this relationship for this scheme, adjustment module 122 provides control signal 160 to control delay module 106 at control terminal 162 to activate the same number of active delay sub-modules 406 in each calibration delay module 502 as are active in delay module 128 after calibrating delay module 128. It will be appreciated that adjustment of delay module 128 may be delayed until the measured delay time of control delay module 106 differs from the desired delay time by a certain percentage. In this case, control delay module 106 is still updated if the measured delay time of control delay module 106 is more or less than its desired delay time. Adjustment module 122 then adjusts delay module 128 when the measured delay time of control delay module 106 differs from the desired delay time by the necessary percentage.

While the above configuration of control delay module 106 provides a straightforward calculation scheme, it will be appreciated that control delay module 106 need not contain multiple calibration delay modules 502(1) to 502(N) but, in another embodiment, may contain only one calibration delay module 502. Further, it will also be appreciated that each calibration delay module 502 may have a different number of delay sub-modules 406 than delay module 128. Any timing relationship between control delay module 106, calibration delay modules 502(1) to 502(N) and delay module 128 may be used to generate scaling factors to adjust delay module 128. However, these alternative schemes would require calculation mechanisms which consider such less direct scaling relationships between the number of delay sub-modules 502 and delay module 128 when calculating adjustments for delay module 128.

It will be appreciated that as the number of calibration delay modules 502 of control delay module 106 increases, the results from calibration module 101 become more precise in calibrating the adjustable delay time of delay module 128. It will also be appreciated that as the period of clock signal 112 decreases, the results from calibration module 101 also become more precise in calibrating the adjustable delay time of delay module 128. It will be appreciated that there is little practical benefit to providing a system having greater precision in timing than the smallest unit of measurement of the delay module 128 being calibrated.

In the embodiment, there are 100 calibration delay modules 502(1) to 502(100) in control delay module 106. In the embodiment, register 118 contains a programmed binary value which represents a count value of the desired delay time of output signal 107 divided by the clock period of clock signal 112. Because of the one-to-one relationship between calibration delay modules 502 and delay module 128, the binary value of register 118 represents a count value that is approximately equal to 100 times the desired delay time of delay module 128 divided by the clock period of clock signal 112. It will be appreciated that the binary value of register 118 may also represent a range of count values. It will further be appreciated that register 118 may have a representation of a different count representing the desired delay.

It will be appreciated that the binary value stored in register 118 may represent the count value associated with the desired delay time or range of delay module 128 rather than that of control delay module 106. In such a case, calibration module 101 processes the count value before comparing the desired delay time or range count value with the measured delay time count value of control delay module 106 to account for additional delay time propagated in control delay module 106 apart from calibration delay modules 502. Calibration module 101 then either multiplies the binary value from register 118 by the number of calibration delay modules 502 in control delay module 106 or takes the average of the delay time propagated by each calibration delay modules 502.

Figure 8:
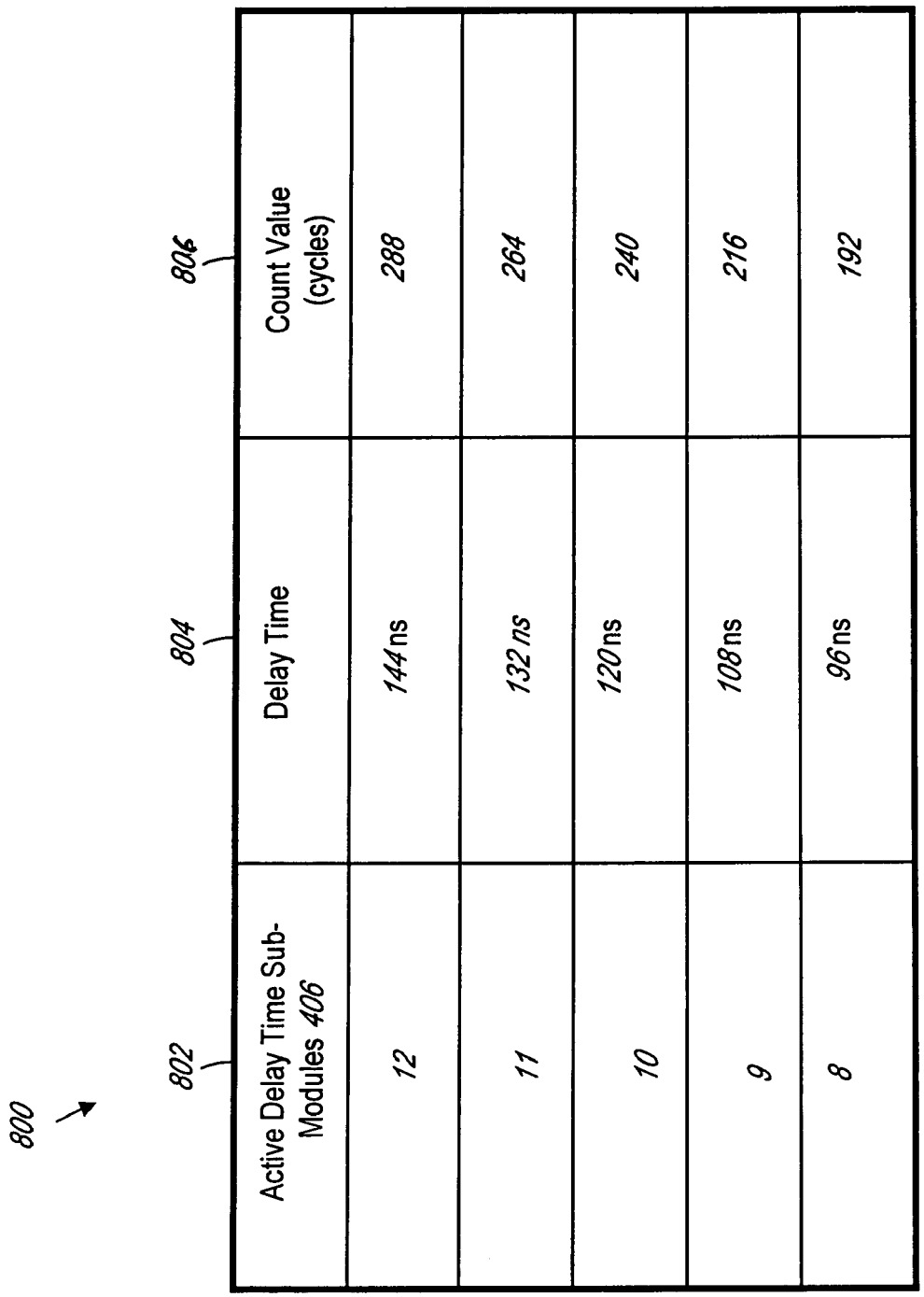

Referring to FIG. 8, values of delay times and count values is given in Table 800 for an example of the calculations of the embodiment of FIG. 1. The measured count value of control delay module 106 (column 806) and its corresponding delay time (column 804) is shown for the number of delay sub-modules 406 active in each calibration delay module 502 of control delay module 106 (column 802).

In the example, the desired delay time of delay module 128 is 0.96 ns. Initially there are 12 delay sub-modules 406 active in delay module 128 to provide this 0.96 ns delay (12×80 ps). To maintain the one-to-one relationship of the embodiment, 12 delay sub-modules 406 are also active in each of calibration delay modules 502(1) to 502(100) in control delay module 106. Assuming no delay is introduced by elements other than calibration delay modules 502, the desired delay time of control delay module 106 is 96 ns (100×0.96 ns). The frequency of clock signal 112 is 2 GHz resulting in a clock period of 0.5 ns/cycle. Accordingly, the binary value stored in register 118 represents a count value of 192 cycles (96 ns÷0.5 ns/cycle).

Calibration module 101 performs a calibration cycle. Pulse signal 104 propagates through control delay module 106. Timing module 108 measures this delay at a count value of 288 cycles or 144 ns. Assuming that delay module 128 produces the average delay time of calibration delay modules 502, delay module 128 will be producing a delay time of 1.44 ns, or a delay time 33% longer than desired. Comparison module 120 produces control signal 150 which indicates that the delay time is longer than desired and adjustment module 122 reduces the number of active delay sub-modules 406 in delay module 128 to 11. To maintain the one-to-one relationship, calibration module 101 also reduces the number of active delay sub-modules 406 in each calibration delay module 502 to 11.

Another calibration cycle measures the delay time of control delay module 106 at a count value of 264 cycles or 132 ns. Since this exceeds the desired count value of 192 cycles, calibration module 101 again reduces the number of active delay sub-modules 406 in delay module. Further calibration cycles continue reducing the number of active delay sub-modules 406 since, as shown by table 800, column 806, at 10 and 9 active delay sub-modules 406, the count value of control delay module 106 exceeds the desired count value represented by the binary value in register 118.

The fourth calibration cycle reduces the number of active delay sub-modules 406 to 8. A fifth calibration cycle measures the delay time of control delay module at a count value of 192 cycles or 96 ns. Delay module 128 should therefore produce a delay time of 0.96 ns, the desired delay time. Comparison module 120 produces a control signal 150 that does not direct adjustment module 122 to adjust delay module 128. Accordingly, no adjustment is made. Additional calibration cycles are performed periodically to account for any additional variation in the delay time of delay module 128. A 2 GHz clock is used in the example for ease of calculation rather than the 334 Mhz clock of the embodiment. It will be appreciated that the above example does not adhere to practical precision limitations described earlier.

Figure 6:
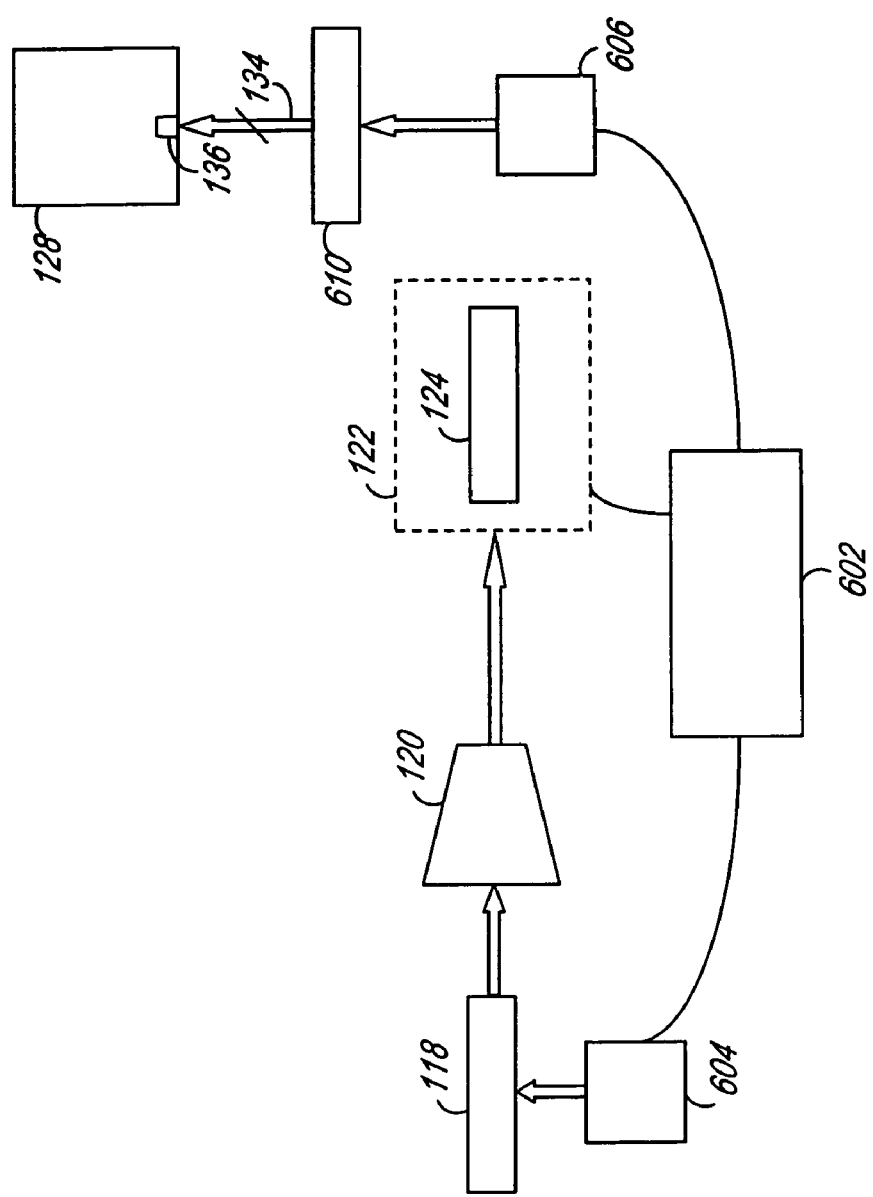
FIG. 6 is a block diagram of another embodiment of the calibration module, shown in part, utilizing a CPU with an electronic circuit in accordance with another embodiment of the invention.

Referring to FIG. 6, in another embodiment, CPU 602 controls aspects of calibration module 101. Software operating on CPU 602 controls values provided to register 118. Calibration module 101 also has threshold lock 604. Threshold lock 604 prevents the count associated with the desired delay time stored in register 118 from being inadvertently updated by the software until threshold lock 604 is deactivated. This ensures that the software on CPU 602 has a safeguard when updating count values of the desired delay time. In the embodiment, threshold lock 604 does not allow the values stored in register 118 to be updated before adjustment module 122 receives enablement pulse 116 at time 206. After CPU updates register 118, threshold lock 604 re-locks. It will be appreciated that any method may be used to re-lock threshold lock 604 after CPU updates register 118. For example, threshold lock 604 may be set to re-lock after a certain period of time or threshold lock 604 may be explicitly re-locked after CPU updates register 118.

In the embodiment, register 610 contains the value used to update delay module 128 rather than register 124. Additionally, calibration module 101 has delay lock 606 associated with register 610. Delay lock 606 prevents the updating of register 610 until delay lock 606 is deactivated. Software on CPU 602 obtains the value to be stored in register 610 from adjustment module 122 which determines how to calibrate delay module 128. It then unlocks delay lock 606 and writes the value to be stored in register 610. The software on CPU 602 then controls the sending of control signal 134 to input terminal 136 of delay module 128 to adjust its adjustable delay time. After CPU updates register 610, delay lock 606 re-locks. Again, it will be appreciated that any method may be used to re-lock delay lock 606 after CPU updates register 610.

It will be appreciated that one register may be used in place of the two registers 124 and 610; however, separating these registers allows for a different value to be stored in register 124 from register 610. A single calibration module 101 may then adjust multiple delay modules 128 with varying delay times, each delay module 128 having a separate register 610 for its own delay time.

It will be appreciated that calibration module 101 need not employ software on CPU 602 to control adjustment module 122 and to update register 118. Instead, the logic for such control may be hard wired as a circuit into adjustment module 122 as well as the value for register 118.

It will be appreciated that calibration module 101 may be directed to perform more frequent calibration cycles on start up of the system employing delay module 128 to provide an initial calibration for process factors using the under-damped method described previously. After compensating for process factors, calibration module 101 then performs less frequent calibration cycles to compensate for voltage and temperature changes in the system employing delay module 128.

It will be appreciated that the embodiment may be used in an electronic circuit to calibrate other parameters. In that case, a control unit module has at least one scaled unit module, each scaled unit module having the same structure as a unit module to be calibrated. The control unit module produces a measurable value, measured by a measurement module. Each scaled unit module would contribute to the measurable value which is processed to produce a scaled unit value. A comparison module compares the scaled unit value to a desired value for the unit module to be calibrated. The comparison result is used to calibrate the unit module. The values that may be calibrated in this manner include voltage, current, power, capacitance, inductance, resistance or any other quantifiable parameter.

It is noted that those skilled in the art will appreciate that various modifications of detail may be made to the embodiments described herein, which would come within the spirit and scope of the invention as defined in the following claims.

WHAT IS CLAIMED IS:

1. A timing calibration system for an adjustable delay time of a delay module for an electronic circuit, said system comprising:
    a control delay module comprising at least one calibration delay module, said control delay module having a second delay time;
    a timing module associated with said control delay module;
    a comparison module associated with said timing module; and
    an adjustment module for said delay module;
    wherein said timing module measures said second delay time, said comparison module compares said second delay time with a desired delay time and produces a comparison result and said adjustment module calibrates said adjustable delay time utilizing said comparison result.

2. The timing calibration system of claim 1, wherein:
    said desired delay time comprises a desired delay time range;
    if said comparison module determines that said second delay time is less than a lower bound of said desired delay time range, said adjustment module increases said adjustable delay time of said delay module; and
    if said comparison module determines that said second delay time is more than an upper bound of said desired delay time range, said adjustment module decreases said adjustable delay time of said delay module.

3. The timing calibration system of claim 2,
    wherein said comparison module comprises a first comparison sub-module, said first comparison sub-module comparing said second delay time to a lower bound of said desired delay time range to produce a first comparison result and a second comparison sub-module,
    said second comparison sub-module comparing said second delay time to an upper bound of said desired delay time range to produce a second comparison result, and
    said adjustment module comprising a counter controlled by an enablement pulse, said counter reacting to said first and said second comparison result and said adjustment module calibrates said adjustable delay time based on said counter.

4. The timing calibration system of claim 1, wherein: if said comparison result indicates that said second delay time is less than said desired delay time, said adjustment module increases said adjustable delay time of said delay module; and if said comparison result indicates that said second delay time is more than said desired delay time, said adjustment module decreases said adjustable delay time of said delay module.

5. The timing calibration system of claim 4, said system further comprising a signal generator, said signal generator generating a pulse signal provided as a first input signal to said timing module and a second input signal to said control delay module, said control delay module producing an output signal provided as a third input signal to said timing module.

6. The timing calibration system of claim 5, wherein an edge of said first input signal initiates said timing module to start a timer and an edge of said third input signal stops said timer, said second delay time being an amount of time measured by said timer.

7. The timing calibration system of claim 1, wherein said delay module comprises at least one delay sub-module and said at least one calibration delay module comprises a plurality of calibration delay modules.

8. The timing calibration system of claim 7, wherein each of said plurality of calibration delay modules comprises a facsimile of said delay module.

9. The timing calibration system of claim 7, wherein said adjustment module calibrates said second delay time of said control delay module.

10. The timing calibration system of claim 1, wherein said timing module is a counter.

11. The timing calibration system of claim 1, wherein said comparison module is a comparator.

12. The timing calibration system of claim 1, further comprising: a desired delay time register associated with said comparison module, said desired delay time register storing said desired delay time and providing said desired delay time to said comparison module; and an adjustment register associated with said adjustment module, said adjustment register storing an adjustment value generated by said adjustment module, said adjustment module adjusting said adjustable delay time of said delay module utilizing said adjustment value.

13. The timing calibration system of claim 12, further comprising a range lock for said desired delay time register, said range lock selectively preventing alteration of said desired delay time stored in said desired delay time register.

14. The timing calibration system of claim 13, further comprising an adjustment lock for said adjustment register, said adjustment lock selectively preventing alteration of said adjustment value stored in said adjustment register.

15. The timing calibration system of claim 14, further comprising a processor associated with said adjustment module, said processor operating a program which provides said desired delay time to said desired delay time register, accesses an output from said adjustment module, generates said adjustment value from said output and provides said adjustment value to said adjustment register.

16. The timing calibration system of claim 14, wherein said timing calibration system is embodied in an ASIC.

* * * * *